(12) United States Patent
Cheng et al.

(10) Patent No.: US 7,439,559 B2
(45) Date of Patent: Oct. 21, 2008

(54) SOI DEVICE WITH DIFFERENT CRYSTALLOGRAPHIC ORIENTATIONS

(75) Inventors: Kangguo Cheng, Beacon, NY (US); Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 11/469,039

(22) Filed: Aug. 31, 2006

(65) Prior Publication Data

US 2007/0080440 A1    Apr. 12, 2007

Related U.S. Application Data

(62) Division of application No. 10/905,002, filed on Dec. 9, 2004, now Pat. No. 7,132,324.

(51) Int. Cl.
H01L 29/74 (2006.01)
(52) U.S. Cl. ............... 257/204; 257/206; 257/E29.257
(58) Field of Classification Search ............... 257/204, 257/206, 657, 347, 527, 369, 371, 29.257, 257/29.346, 29.262, 29.318
See application file for complete search history.

(56) References Cited

U.S. PATENT DOCUMENTS

2004/0195622 A1* 10/2004 Hwang et al. ............... 257/347

* cited by examiner

Primary Examiner—Walter L Lindsay, Jr.
(74) Attorney, Agent, or Firm—Steven Capella

(57) ABSTRACT

A method of forming a memory cell having a trench capacitor and a vertical transistor in a semiconductor substrate includes a step of providing a bonded semiconductor wafer having a lower substrate with an [010] axis parallel to a first wafer axis and an upper semiconductor layer having an [010] axis oriented at forty-five degrees with respect to the wafer axis, the two being connected by a layer of bonding insulator; etching a trench through the upper layer and lower substrate; enlarging the lower portion of the trench and converting the cross section of the upper portion of the trench from octagonal to rectangular, so that sensitivity to alignment errors between the trench lithography and the active area lithography is reduced. An alternative version employs a bonded semiconductor wafer having a lower substrate formed from a (111) crystal structure and the same upper portion. Applications include a vertical transistor that becomes insensitive to misalignment between the trench and the lithographic pattern for the active area, in particular a DRAM cell with a vertical transistor.

8 Claims, 10 Drawing Sheets

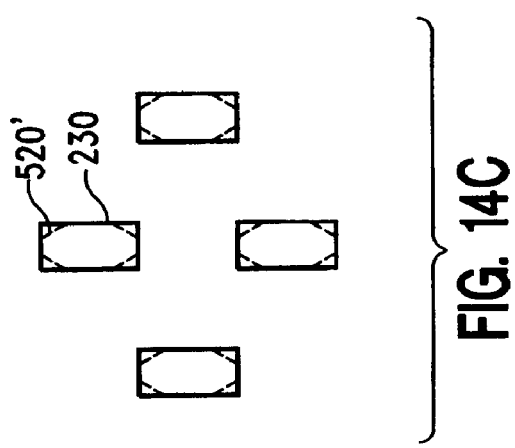
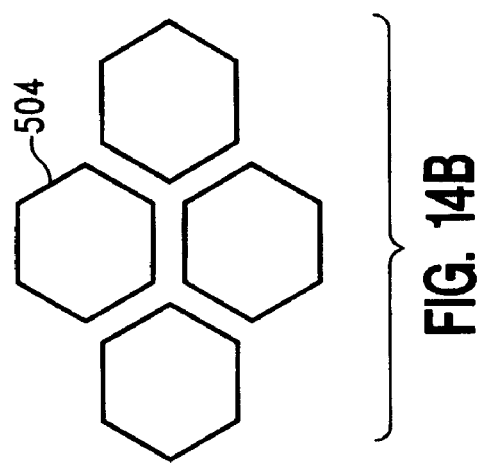
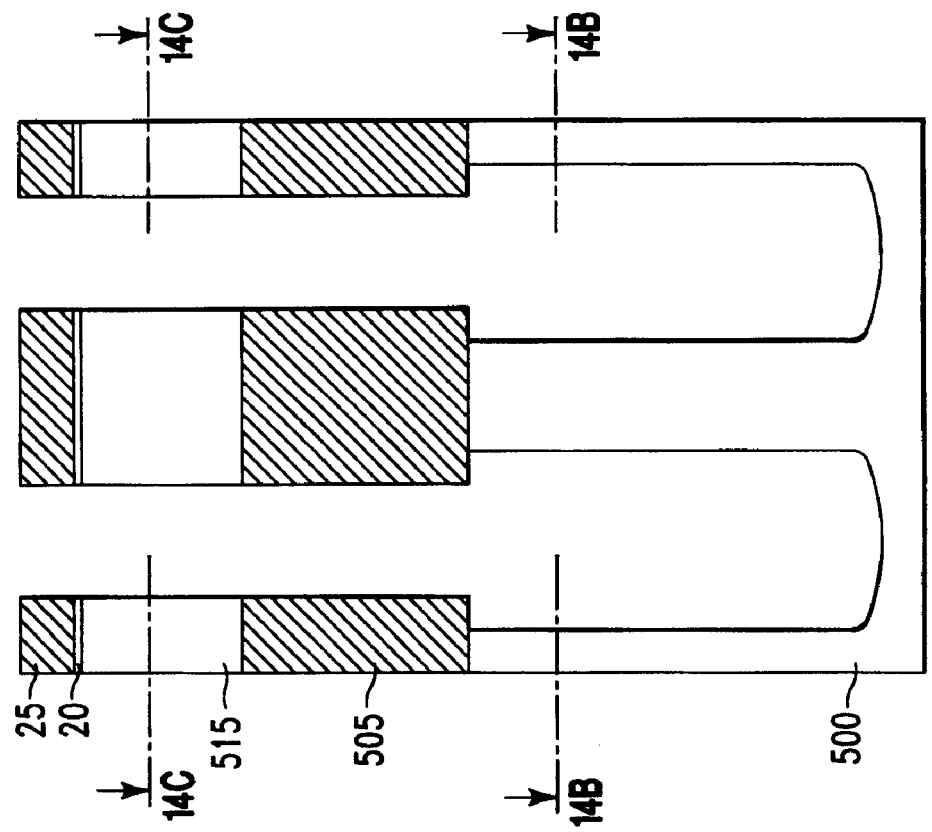

SOI DEVICE WITH DIFFERENT CRYSTALLOGRAPHIC ORIENTATIONS

This application is a divisional of U.S. patent application Ser. No. 10/905,002 filed Dec. 9, 2004, now U.S. Pat. No. 7,132,324.

TECHNICAL FIELD

The field of the invention relates to integrated circuits having trenches formed in an SOI substrate, and more particularly to trench memory devices having a vertical transistor above a trench capacitor.

BACKGROUND OF THE INVENTION

FIG. 1B illustrates in simplified form a cross section of a pair of partially completed DRAM cells formed in substrate 10 and having a P-well 15. A trench has been etched into the substrate and capacitor 100 has been formed in the lower portion, with buried plate 107, dielectric layer 106, and center electrode 110.

In the upper portion of the trench, a vertical transistor 200 has been formed, with buried strap 127 as the lower electrode, gate 140 and upper electrode behind the plane of the paper.

Lower collar 122 and isolating dielectric are conventional. Pad oxide 20 and pad nitride 25 will be replaced by the array top oxide and wordlines and bitlines will be added later.

In the course of etching a deep trench in a silicon substrate, a conventional configuration of orienting the trench in a (100) wafer is the <100> configuration, in which the long axes of the oval trenches are printed at the wafer surface parallel to a <100> crystallographic direction of the substrate (diagramed in FIG. 1A). In this configuration, the formed trench assumes a square shape in the bottom, as shown in FIG. 2A with dashed line 102 as the initial trench boundary and solid line 104 as the boundary after bottle etch; an oval shape at the wafer surface, as shown in FIG. 2C; and an octagon shape 220 in the upper portion of the trench, as shown in FIG. 2B. The change of trench shape at different depth is due to the fact that etch rates are different at different crystallographic orientations. Specifically, the {100} surfaces of the silicon are etched at a greater rate than the {110} surfaces.

The <100> configuration has the advantage that the capacitance can be maximized by using the bottle etch step without having an excessive risk of trench merging because the differential etching along the crystal planes produces a square cross section that packs together tightly, even after the step of bottle etching. However, the octagonal cross section of the upper trench where the vertical capacitor is formed matches poorly with the stripe 210 that defines the active area (AA) by defining the isolation structures that separate devices and structures on the wafer surface.

FIG. 2B shows AA strips 210 that meet the octagons 220 that represent the trench cross section such that the corners of the octagons are at the trench-AA intersection. This results in the undesired variation of vertical transistor characteristics such as threshold voltage (Vt) when the trench-AA intersection is located slightly away from the corner or at the corner of the octagon.

Thus, the requirement of getting the highest capacitance in the trench and avoiding shorts between capacitors conflicts with the need for a tight alignment tolerance between the trench and the AA level.

FIG. 3B shows a cross section similar to FIG. 1B for an alternative version of a cell. FIG. 3A illustrates a difference in the crystal orientation of this version. The long axis of the trench is parallel to the <110> crystal axis. The results of this different crystal orientation are shown in FIG. 4, in which FIG. 4C shows the same printing on the top surface as FIG. 2C. FIG. 4B shows that the etching process produces an elongated octagon in the top portion of the trench where the vertical transistor is located. This has the beneficial effect of alleviating the alignment problem characteristic of the previous version because the AA stripe 210 is less likely to overlap corners of the elongated octagons 220'.

FIG. 4A illustrates a drawback of this version of the cell. The crystal orientation produces rectangular cross sections in the lower portion of the trenches. Trenches with such a shape have a tendency to merge with one another, so that it is necessary to increase the spacing between cells to avoid merging. Dashed lines 102' show the trench boundary before bottle etch and solid lines 104' show the boundary after bottle etch.

Scaling trench DRAM cell devices to sub-100 nm generations faces several challenges. First, the trench capacitance has to be maintained at a certain value (e.g. above 30 fF/cell) so that the device can function properly. Unfortunately, as the trench size is scaled down, the trench depth is also decreased. This directly translates to a decrease of capacitance. Capacitance enhancement after deep trench etch has to be implemented for sub-100 nm trench memory devices.

The second challenge is the tight overlay tolerance. Misalignments could lead to the degradation or even failure of the device. Techniques have been developed for each individual issue, but integration of these techniques to solve all these issues at the same time is extremely difficult. The difficulty is due to the fact that the preferred trench orientation with respect to silicon substrates for some techniques is undesired for other techniques.

For example, widening the trench by wet etching silicon to form a bottle in the capacitance region is one of the most straightforward techniques for trench capacitance enhancement. The <100> configuration in which trench axes are parallel to the <100> directions of the silicon substrate, is desired for a maximal capacitance enhancement. However, this configuration results in a minimal tolerance for the AA (active area) to DT (deep trench) overlay.

On the other hand, the AA-DT overlay tolerance becomes maximal for the <110> configuration in which the trench axes are parallel to the <110> direction of the silicon substrate, but this configuration suffers from trench merging when a bottling process is implemented.

The art could benefit from a trench capacitor - vertical transistor process that preserves tight tolerance between the trench and the active area.

SUMMARY OF THE INVENTION

The invention relates to a trench in a SOI semiconductor substrate that has a first cross section at the bottom portion of the trench and a rectangular cross section at the top portion of the trench, the trench being formed in a bonded SOI wafer having a first orientation of a first wafer type in a lower section and a <110> orientation of a (001) wafer type in an upper section.

A feature of the invention is the trench being formed in a bonded SOI wafer having a <100> orientation in a lower section and a <110> orientation in an upper section, both sections being (001) wafers.

A feature of the (001) wafer embodiment is that the SOI layer and the substrate have their [010] axes oriented at a forty-five degree angle with respect to one another, so that the cross section in the upper portion is rectangular and the cross section in the lower portion is square, oriented at 45 degrees with respect to the rectangles.

A feature of the invention is the trench being formed in a bonded SOI wafer having a (001) wafer in an upper section, and a (111) wafer in a lower section.

A feature of the invention is that the cross section in the upper portion is rectangular and the cross section in the lower portion is hexagonal.

A feature of the invention is that an etch in the trench simultaneously enhances capacitance by enlarging the lower portion of the trench in a bottle etch and converting the cross section of the upper portion in the SOI layer from octagonal to rectangular, thereby improving the DT-AA alignment.

BRIEF DESCRIPTION OF THE DRAWINGS

FIG. 14A shows a cross section of a trench according to the invention after the simultaneous etching of the upper and lower sections.
FIGS. 14B-14C show cross sections of the structure of FIG. 14A at different depths.

DETAILED DESCRIPTION

Figure 1B:
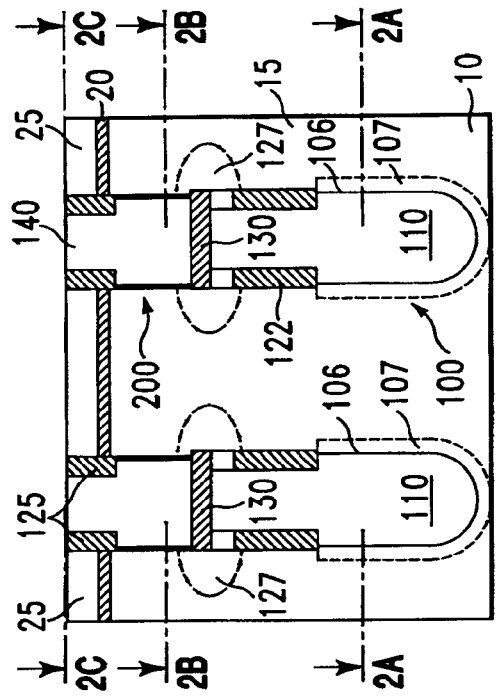
FIGS. 1A-1B show an example of a prior art structure.

FIG. 1B shows a cross section of a prior art DRAM cell formed in a bulk substrate and having a conventional arrangement of a trench capacitor and a vertical transistor, well known to those skilled in the art.

The space saving advantages of the vertical DRAM cell are also well known in the art. It is also well known that as the dimensions of lithography shrink, it becomes more difficult to maintain adequate tolerances between adjacent trench capacitors and the pattern for the active area of the upper portion of the cell that contains the transistor.

At the bottom of FIG. 1B, silicon substrate 10 contains a trench capacitor having a center capacitor electrode 110, a buried plate 107 formed by diffusing dopant(s) into the substrate and separated from the center electrode by capacitor dielectric 106. Other capacitor structures such as having textured hemispherical grained silicon or multi-plate capacitors (not shown) may also be used.

Figure 1A:
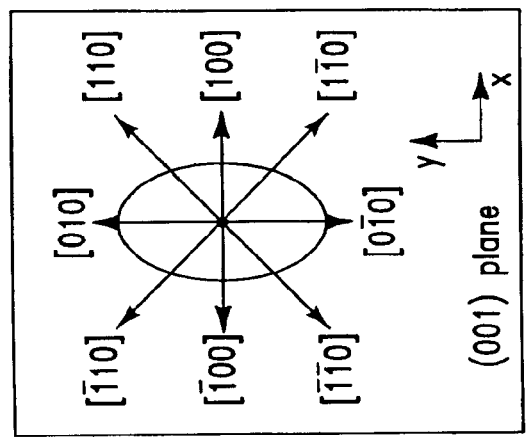

FIG. 1A shows the trench as printed before etching on a top view of the substrate, with x and y axes being along the [100] and [010] directions, respectively, with the wafer axis direction indicated by the x and y arrows. The notation used will be that the x and y axes are referred to the wafer (and directly or indirectly to the wafer alignment marks) and the axes of the trenches and the crystal axes are referenced to that. For convenience, the y axis will be referred to in the claims as the first wafer direction.

Figure 2A:
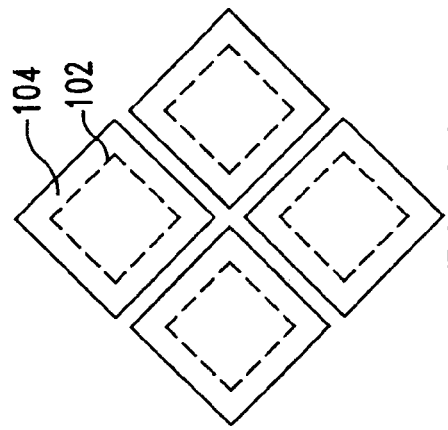
FIG. 2A-2C show cross sections of the structure of FIG. 1 at different depths.

FIG. 2A shows a cross section of the capacitor looking down from above through line 2A-2A in FIG. 1B. In this view, the square cross section of the capacitor shows clearly. The trench has the standard <100> configuration in which the long axis of the oval trench printed at the wafer surface is parallel to an [010] crystallographic direction of the substrate (diagrammed in FIG. 1A). The squares in the cross section are shown oriented at 45 degrees with respect to the axis of the drawing. The cause of this orientation is that the silicon substrate is oriented with respect to the lithographic pattern such that the axis of the trench (vertical in the drawing) is parallel to a <100> direction in the {001} substrate. During the etching process, the difference in etch rates between the crystal planes causes the 45 degree orientation of equal length sides.

FIG. 2A shows an arrangement of four neighboring cells after conventional bottle etch that has expanded the transverse dimensions of the etched trench (102) to line 104. This etch permits closer spacing of the trenches and increases the capacitance of the cells.

Figure 2B:
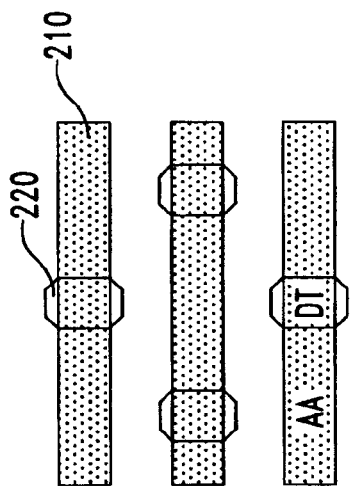

FIG. 2B shows the alignment of the upper portion 220 of the cells, having the conventional octagonal shape of the prior art trenches, and strips 210 of the active area layout. It will be apparent to those skilled in the art that alignment of an octagon with respect to a strip will produce a different threshold voltage Vt in the transistor, depending on the exact alignment or lack of alignment of the corners of the octagon with respect to the strip 210.

Figure 2C:
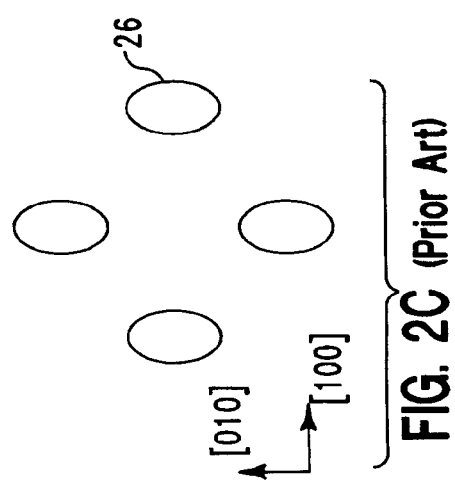
Figure 4A:
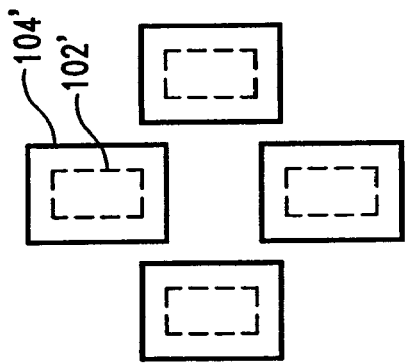
FIGS. 4A-4C show cross sections of the structure of FIG. 3 at different depths.

FIG. 2C shows the conventional oval shape 26 of the surface of the cell, at the pad insulator or other non-silicon top surface.

Cells according to the invention have the compact arrangement of the capacitors shown in FIG. 2A and the oval shapes of the surface, as shown in FIGS. 2C. The structural difference provided by the present invention is in the shape of the upper portion of the cell that holds the transistor and in the economical method of producing that result.

Figure 3B:
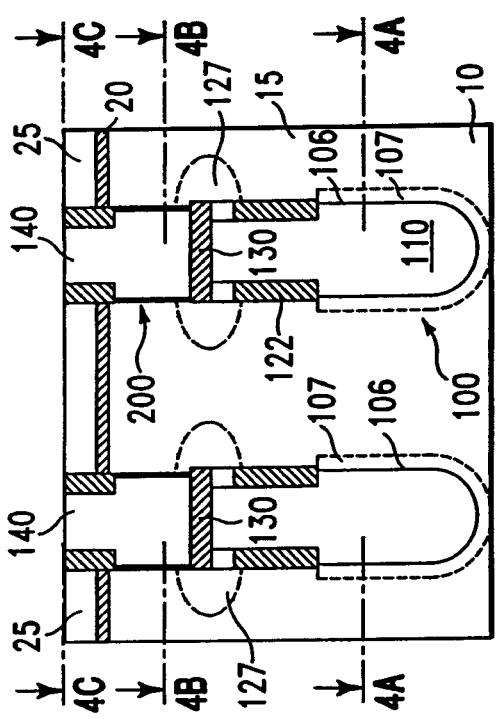
FIGS. 3A-3B show an alternative prior art structure.
Figure 3A:
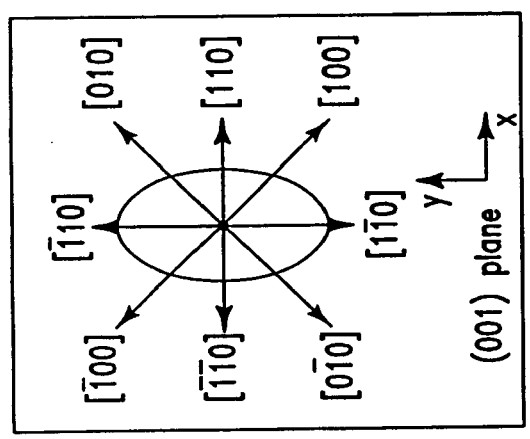
Figure 4C:
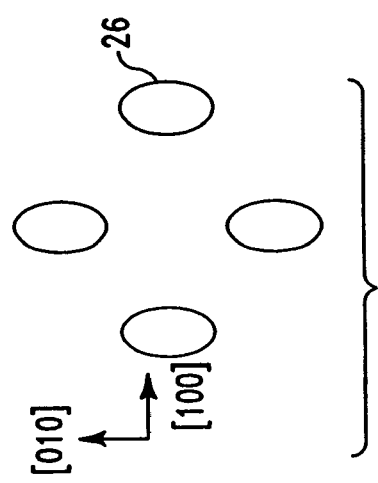

As discussed above, the crystal orientation shown in FIG. 3 has the benefit of better alignment of the DT and the AA, but also has the drawback that the cell is susceptible to trench merging issue well known in the art.

Figure 5A:
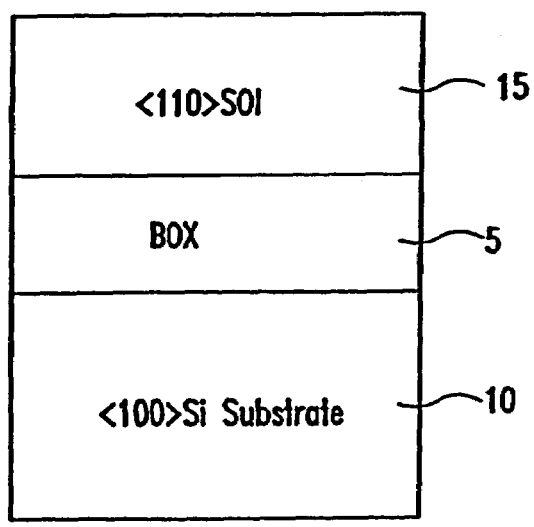
FIGS. 5A-5C show a wafer according to the invention.
Figure 5B:
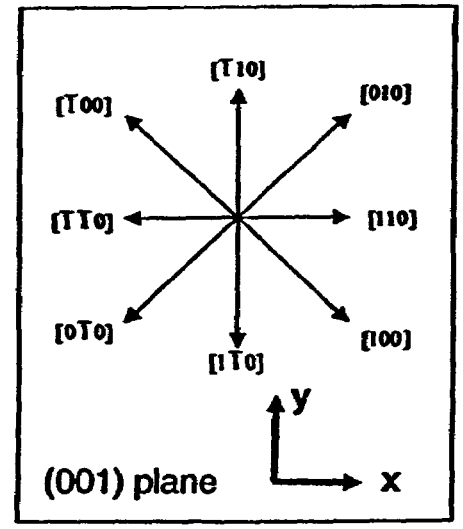
Figure 5C:
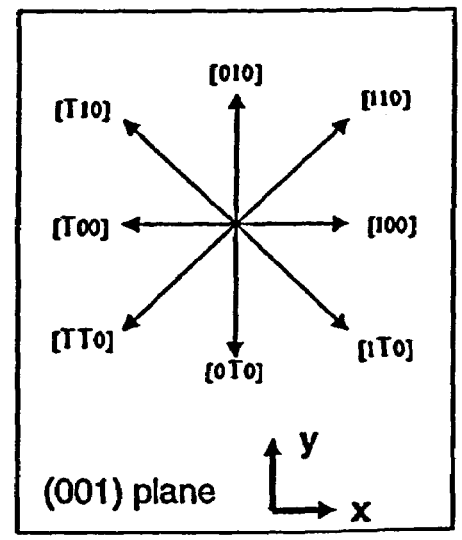

FIG. 5A shows the construction method according to the invention that preserves the advantageous compact arrangement of the capacitors. FIG. 5A shows a cross section of a bonded wafer with lower section 10 being a silicon wafer oriented in the conventional <100> way. FIG. 5C shows the orientation of the crystal directions with respect to the wafer coordinates x and y; i.e. the [010] axis of the substrate 10 is aligned with the y-direction of the wafer coordinate system.

At the top of FIG. 5A, SOI layer 15 is a second wafer oriented <110> with respect to the same wafer coordinate system. FIG. 5B shows the corresponding crystal directions, with the [010] axis being at a 45 degree angle with respect to the y axis of the wafer (and with respect to the [010] axis of the lower wafer). The insulating layer 5, conventionally an oxide layer, forms the bond between the two wafers. Alternatively, the second wafer oriented <110> with respect to the same wafer coordinate system can be directly bonded to the first wafer oriented in the conventional <100> way.

Figure 4B:
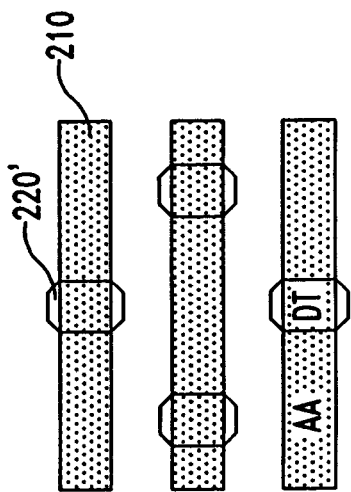

The result of the bonding according to the invention is that the lower section has the desirable close packing of the expanded trenches shown in FIG. 2A and the upper section has the desirable tolerant alignment of FIG. 4B.

Figure 6:
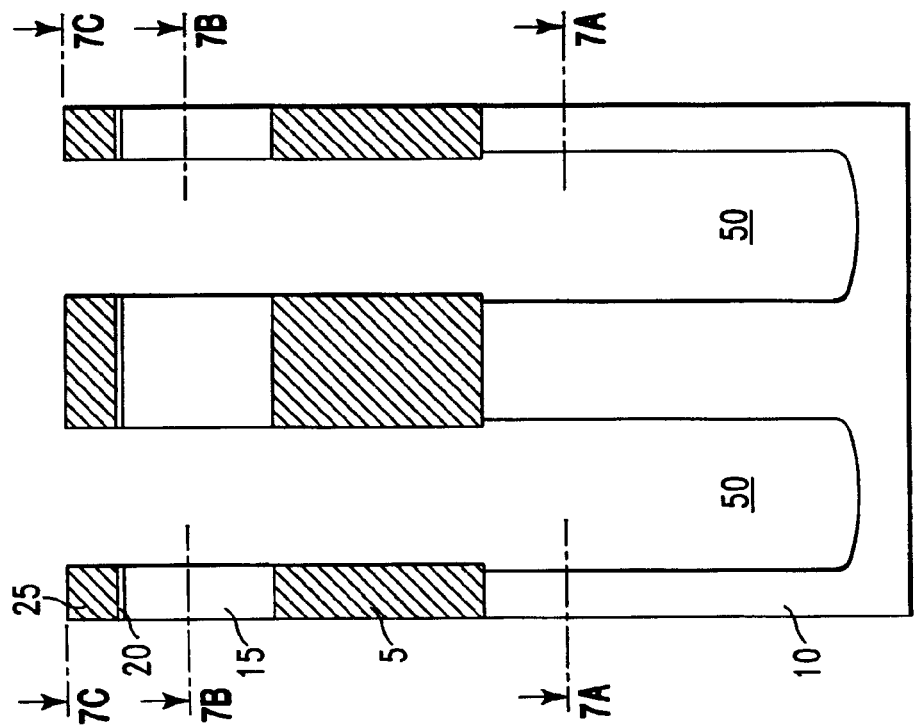
FIG. 6 shows the result of etching the trench according to the invention.

According to the invention, the preliminary steps of etching the trench down to form the basis for the capacitor are conventional. FIG. 6 shows a trench 50 that has been etched through the bonded wafer according to the invention; passing trough the pad nitride 25, pad oxide 20, SOI 15, the optional bonding oxide 5 and into substrate 10. A reactive ion etch (RIE) with parameters and chemistry set for directional etching etches into the substrate 10 to an appropriate depth that is about 8 microns in contemporary technology. FIG. 6 shows the trench before deposition of capacitor dielectric 106 and forming the buried plate 107.

Figure 7C:
FIGS. 7A-7B show cross sections of the structure of FIG. 6 at different depths.

As shown in FIG. 7C, lithography defines an oval pattern on wafer surface with its axes parallel to the <110> directions of the crystal.

Figure 7A:
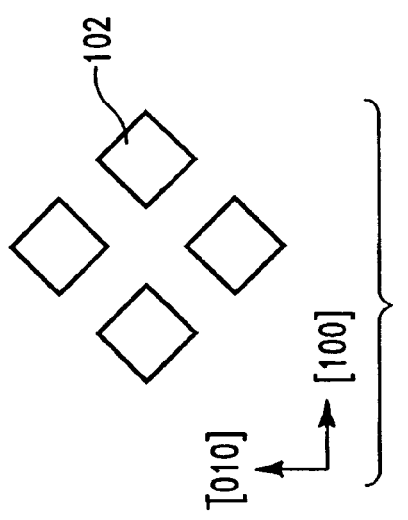
Figure 7B:
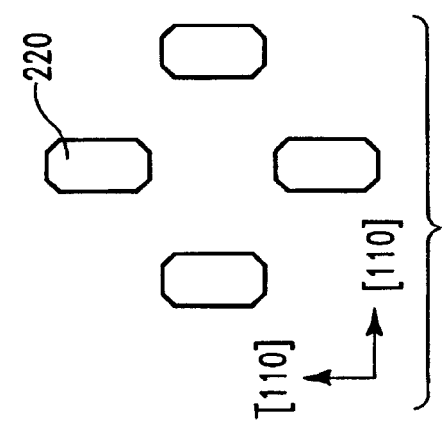

FIG. 7B shows a typical <110> orientation of the upper SOI layer in which the long sides of the octagonal shapes 220 are parallel to the wafer y axis and to the [110] axis of the SOI layer. This axis is at 45 degrees with respect to the squares of FIG. 7A. The AA strips, denoted with numeral 210 in FIG. 4B, can be aligned with the rectangular cross sections of the upper trench portions in a manner that is insensitive to misalignment. Since there is no corner near the intersection of the AA strip and the upper trench, the problem of variation in transistor Vt as a result of slight misalignment does not arise.

FIG. 7A is similar to FIG. 2A, in which boundaries 102 of the trenches will be later expanded with a bottle etch to the configuration shown in FIG. 2A.

Figure 9A:
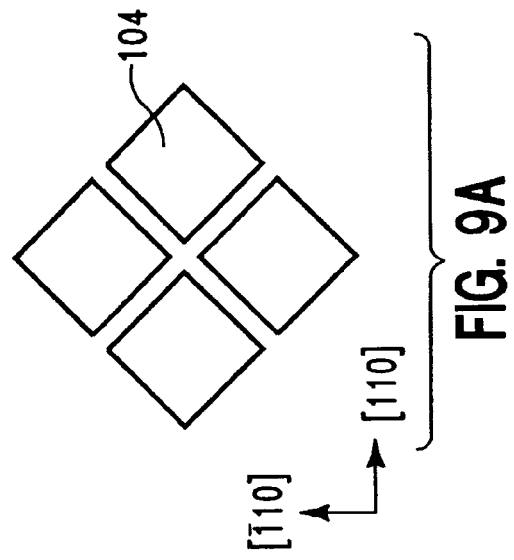
FIGS. 9A-9B show cross sections of the trenches of FIG. 8.
Figure 9B:
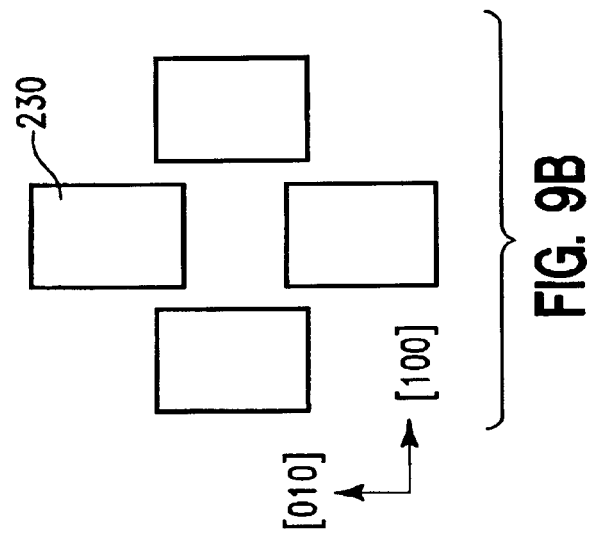
Figure 8:
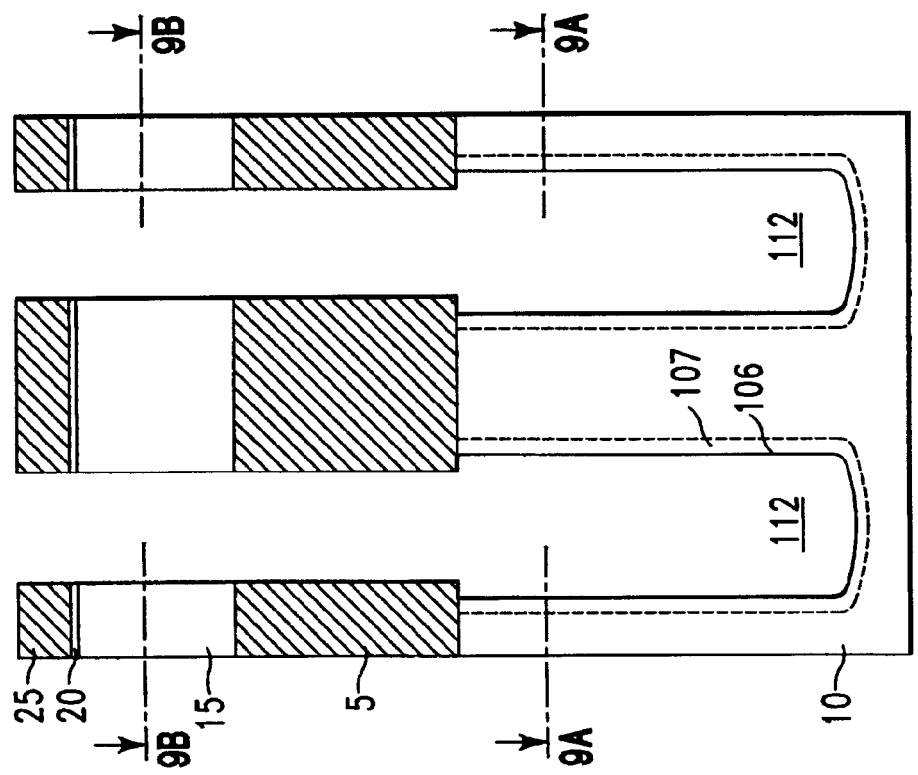
FIG. 8 shows a cross section of a trench according to the invention after the simultaneous etching of the upper and lower sections.

Referring to FIG. 8, the trench in both the lower section and the upper section of the trench is processed according to the invention. After the trench is formed with an initial cross section, a wet etch that etches the {100} planes at a greater rate than {110} planes, is performed. The lower cross section is extended the sides of the trench laterally to lines 104 in FIG. 9A. Simultaneously, the left and right sides of shapes 220 in the upper portion are lengthened to convert the octagonal shapes to rectangles, as shown as lines 230 in FIG. 9B. A wet etch containing ammonia can be used to shape the lower and the upper sections due to the fact that ammonia etches silicon at different rates on different crystalline planes. Other etch processes that have different etch rate at different crystalline orientations may be used for trench shaping, such as a KOH etch or plasma etch, for example. The oxide layer 5, if present, may be etched back to align its sidewall to the upper trench sidewall. Alternatively, the upper and the lower sections can be shaped in separate processes.

Figure 10:
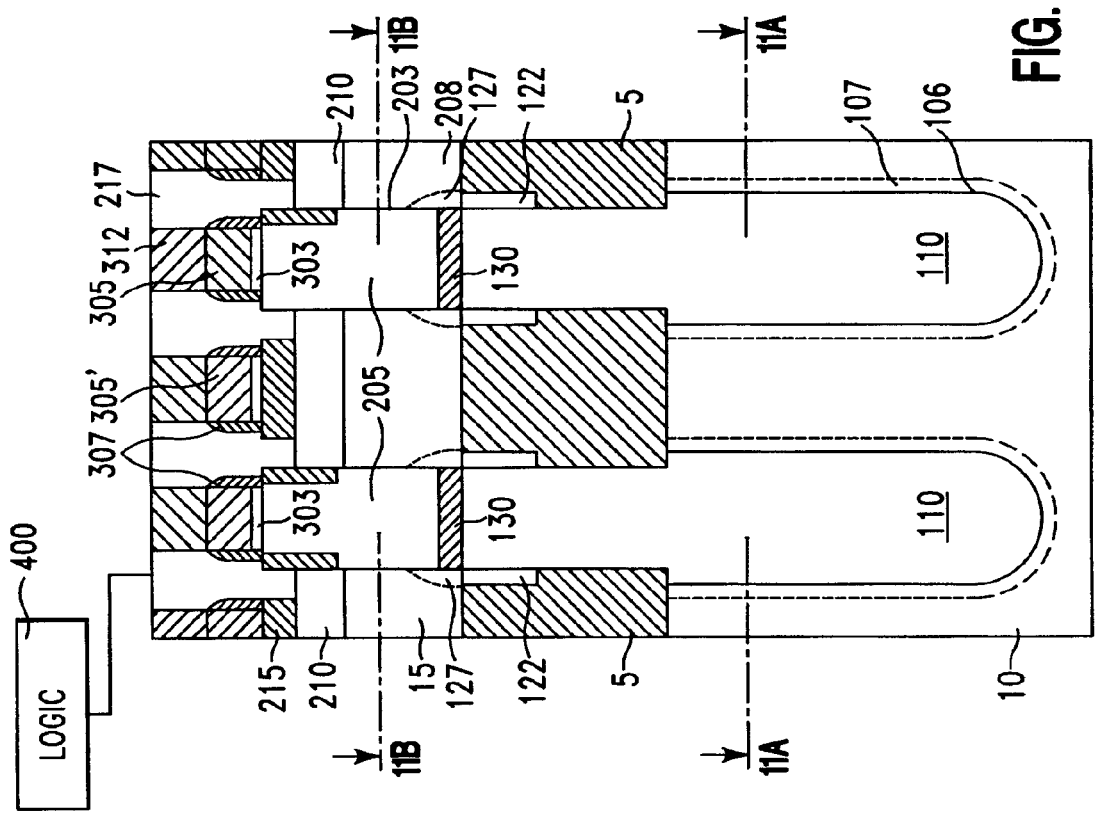
FIG. 10 shows cross sections of a trench memory cell according to the invention.

FIG. 10 shows a cross section of a completed structure according to the invention. Buried plate 107 has been formed at any convenient time by diffusion, e.g. gas phase diffusion or solid phase diffusion, into the substrate. Preferably, the diffusion extends such that adjacent buried plates make electrical contact in contemporary technology. A dielectric 106 e.g. oxynitride or other high-k dielectric materials, is formed by conventional thermal growth and/or deposition processes, followed by filling with conducting material(s) 110, e.g., doped polysilicon, to form the center electrode.

A trench structure according to the invention does not use a conventional trench collar such as 122 in FIG. 1B. Bonding oxide 5 lines the section of the trench that separates the lower capacitor portion of the trench from the upper portion that holds the vertical transistor. Oxide 5 performs the functions of collar 122 in the prior art and also prevents leakage between the P-well 15 and the buried plate. In addition, diffusion from the buried strap is suppressed by oxide 5, reducing back-to-back leakage.

The DRAM cell illustrated is completed by forming vertical transistors in the trenches. Buried strap 122 is formed and lower electrode outdiffusion (or buried strap out diffusion) 127 is formed conventionally.

A separation insulator 130 referred to as the trench top oxide (TTO) is formed above the poly center electrode 110. Formation of TTO 130 completes the processing of the lower portion of the cell. The trench in the lower portion does not change its shape after this step. A cross section is shown in FIG. 11A.

Figure 11B:
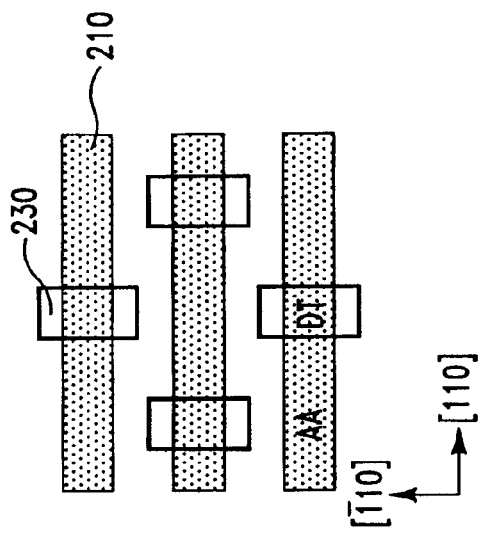
FIGS. 11A-11B show cross sections of the trenches of the trenches of FIG. 10.
Figure 11A:
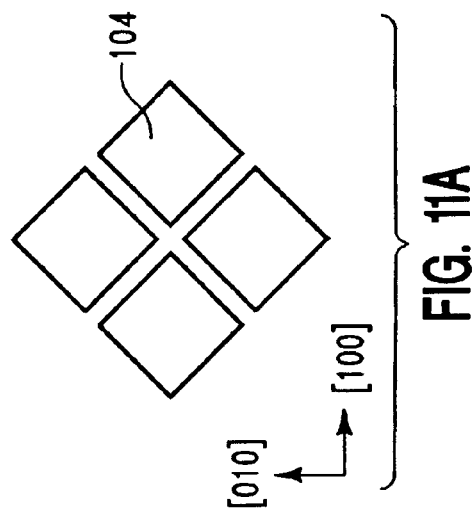

FIG. 11B shows the improved alignment possible with cells made according to the invention. Misalignment of the AA strips 210 in the vertical direction in FIG. 11B will not affect the amount of overlap between the strip and the rectangles 230.

The DRAM cell is completed by forming the vertical transistor in the upper trench conventionally by forming gate dielectric 203 on the trench walls, filling the upper trench with gate conductor 205 to form the transistor gate and forming the upper transistor electrode 210. The gate dielectric 203 may include, but is not limited to, oxide, nitride, $Al_2O_3$, $HfO_2$, HfSiO, $ZrO_2$, formed by conventional thermal growth and/or deposition processes. Preferably the gate dielectric 203 is an oxide layer with the thickness of 60 angstroms formed by thermal growth. Gate contact isolation 222 and the gate contact 205 are formed thereafter. The gate conducting material 205 may include, but is not limited to, doped polysilicon, metals, conducting nitride. Preferably the gate conductor 205 is arsenic-doped polysilicon formed by a LPCVD process.

Insulator 215 (Array Top Oxide) replaces the pad oxide and pad nitride.

Wordlines, comprised of a lower conducting layer 303, (e.g., doped polysilicon, tungsten, and/or tungsten silicide) and insulating cap 305 (e.g., nitride and/or oxide) make contact to gate 205. Sidewalls 307 along with the insulating layer 312 (e.g. BPSG), separate the gate contact from the bitline contacts 217 which connects to the upper electrode 210.

FIGS. 12-15 illustrate steps in an alternative embodiment that uses a (111) wafer as substrate 10.

Figure 12A:
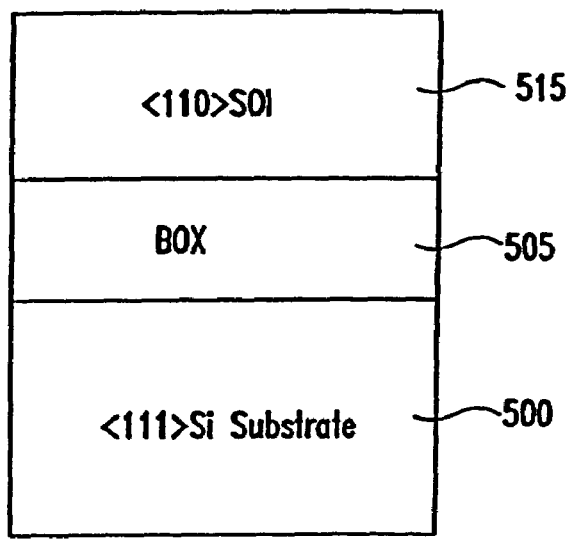
FIGS. 12A-12C show a wafer used in the alternative embodiment.
Figure 12B:
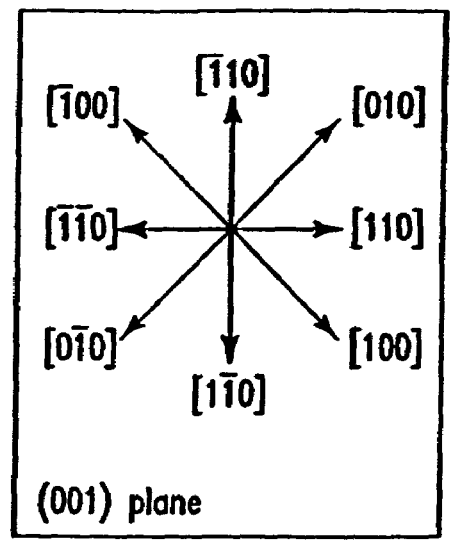
Figure 12C:
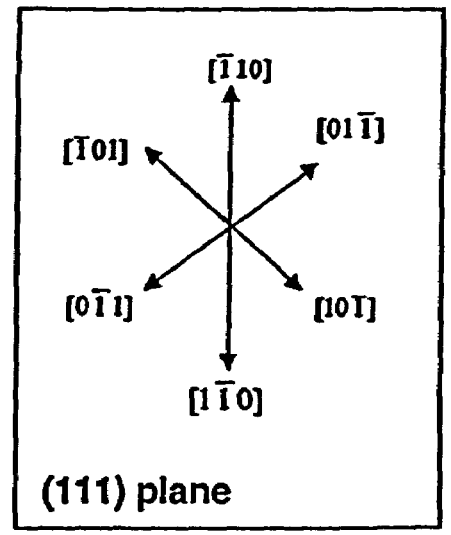

FIG. 12A, comparable to FIG. 5A, shows a cross section of the starting wafer after bonding and thickness reduction of the upper device (SOI) layer. FIGS. 12B shows the same orientation as FIG. 5B and FIG. 12C shows an example of the orientation of the lower wafer. As will be seen below, since the (111) substrate is symmetric, the trench cross section in the lower portion will be hexagonal. This has the advantage that the orientation of the lower substrate does not matter. In this example, the [110] axes of the lower substrate and upper layer are parallel.

The cross section of the trench in the upper layer is the same as in the previous version, since the upper layer has the same material and the same orientation with respect to the desired long axis of the trench.

Figure 13C:
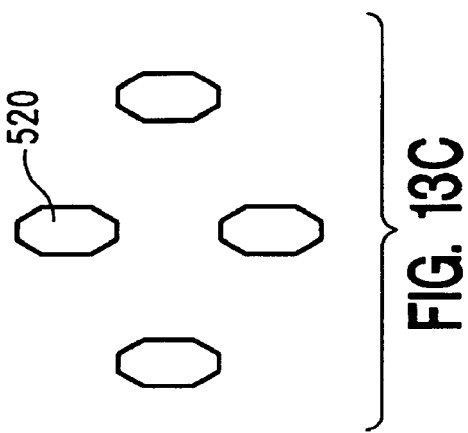
FIGS. 13B-13C show cross sections of the structure of FIG. 13A at different depths.
Figure 13B:
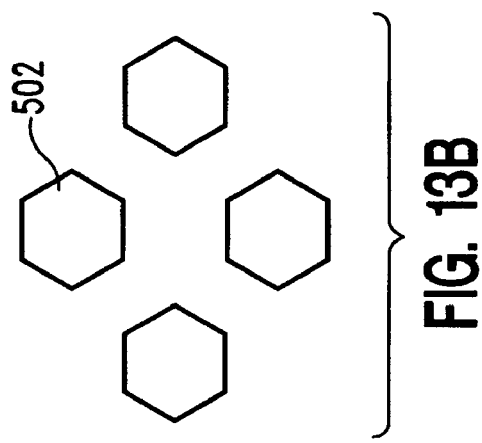
Figure 13A:
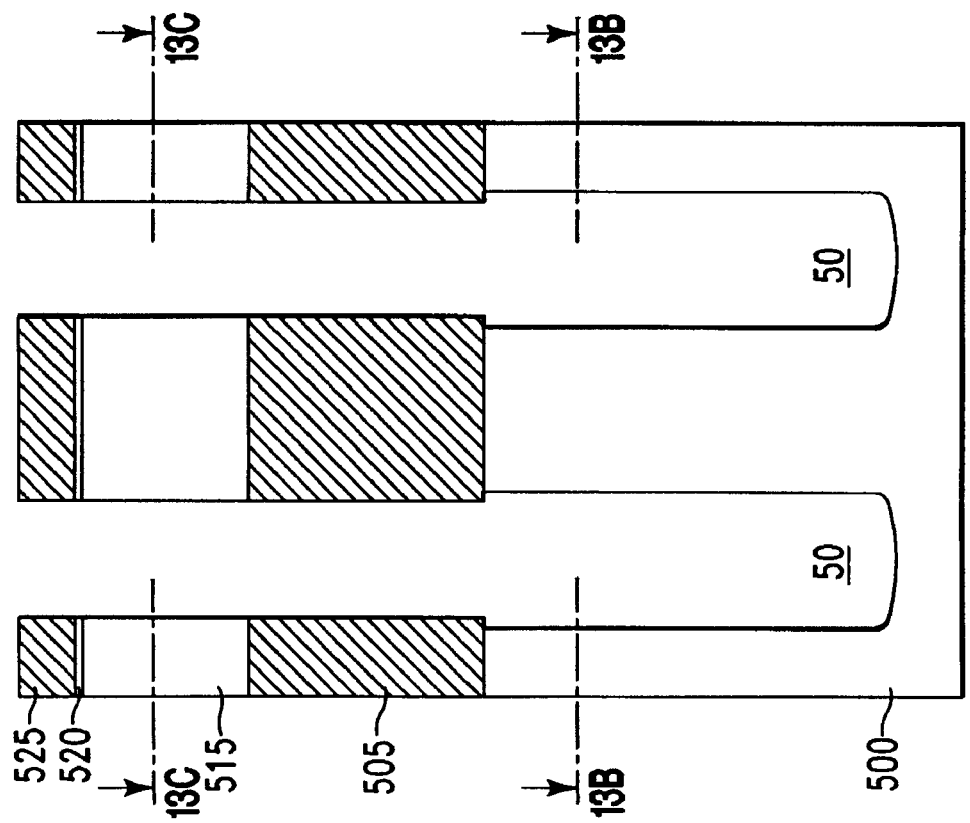
FIGS. 13A shows a cross section of the structure in the alternative embodiment after etching the trench.

FIG. 13A shows the trench after the first directional dry etch. FIG. 13B show a cross section in the lower substrate with hexagons 502. FIG. 13C shows the cross section in the upper layer with octagons 520, similar to the corresponding FIG. 7B.

FIG. 14A shows the trench after the bottle etch, with a significant enlargement of the cross section in the lower substrate to produce hexagons 504. The octagons 520 in the upper layer have been enlarged and etched differentially along crystal planes to produce a rectangular cross section 230, as before. Within rectangles 230, dotted lines 520 indicate that a perfect rectangle is not required and there may be some remnants of the 45 degree planes. For the purposes of the claims, the cross section will be referred to as rectangular if the elongated sides of the upper cross section are longer than the width of AA strip 210, so that the AA strip does not overlap the corners of the upper cross section.

In this example, an oxide etch has been applied to the bonding oxide 505 to enlarge the cross section in this portion of the trench to the same amount as in the upper layer.

Figure 15C:
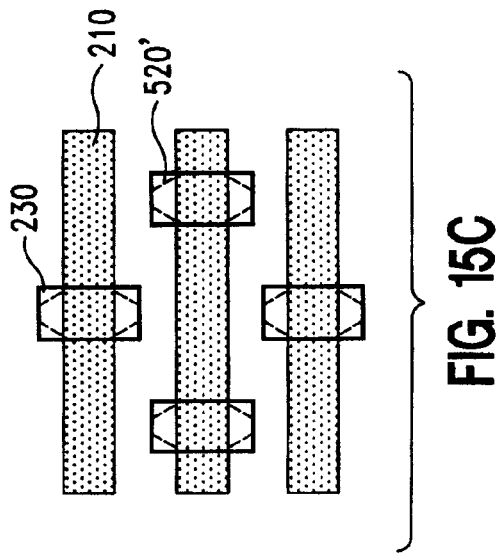
FIGS. 15B-15C show cross sections of the structure of FIG. 15A at different depths.
Figure 15B:
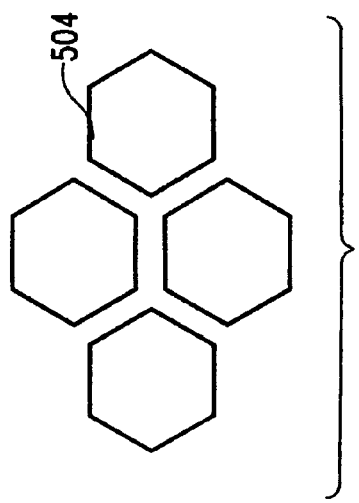
Figure 15A:
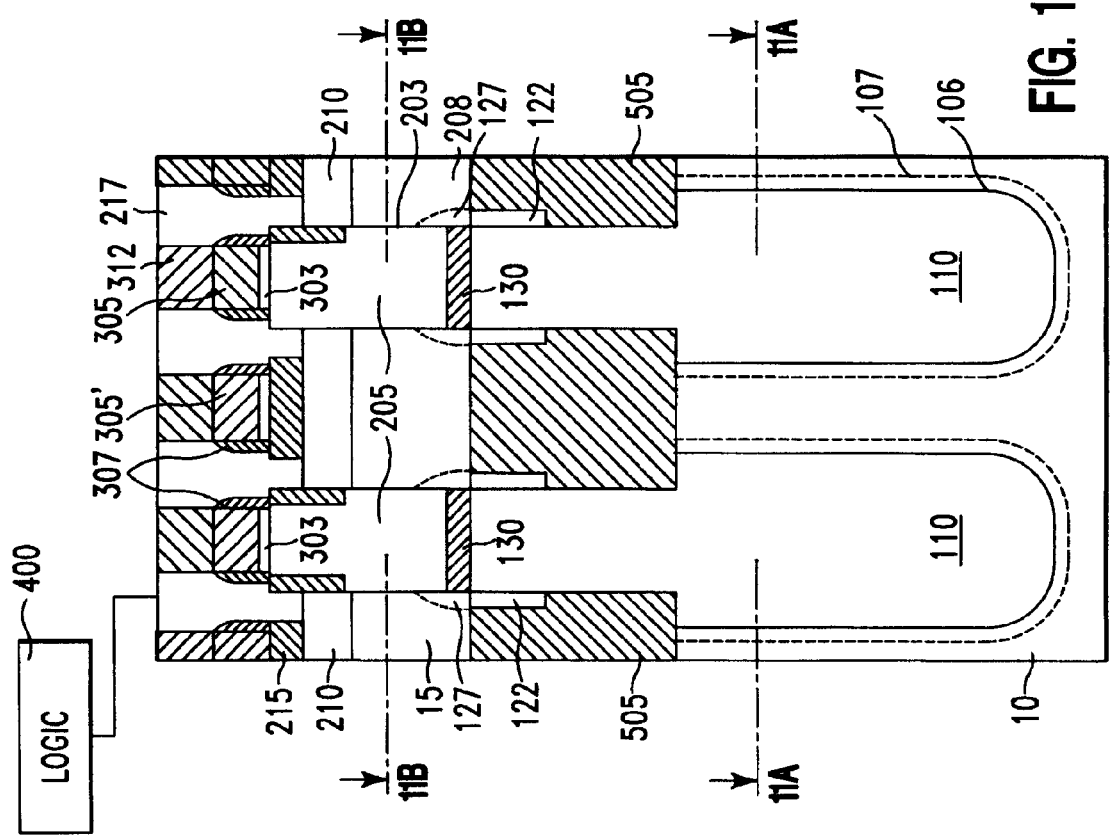
FIG. 15A shows a cross section of a completed memory cell according to the invention.

FIG. 15A is a counterpart to FIG. 10, with the same numeral referring to the same elements. FIG. 15A shows a cross section of a completed structure according to the invention. Buried plate 107 has been formed at any convenient time by diffusion, e.g. gas phase diffusion or solid phase diffusion, into the substrate. Preferably, the diffusion extends such that adjacent buried plates make electrical contact in contemporary technology. A dielectric 106 e.g. oxynitride or other high-k dielectric materials, is formed by conventional thermal growth and/or deposition processes, followed by filling with conducting material(s) 110, e.g., doped polysilicon, to form the center electrode.

A trench structure according to the invention does not use a conventional trench collar such as 122 in FIG. 1B. Bonding oxide 505, if present, lines the section of the trench that separates the lower capacitor portion of the trench from the upper portion that holds the vertical transistor. Oxide 505 performs the functions of collar 122 in the prior art and also prevents leakage between the P-well 515 and the buried plate. In addition, diffusion from the buried strap is suppressed by oxide 505, reducing back-to-back leakage.

The DRAM cell illustrated is completed by forming vertical transistors in the trenches. Buried strap 122 is formed and lower electrode outdiffusion (or buried strap out diffusion) 127 is formed conventionally.

A separation insulator 130 referred to as the trench top oxide (TTO) is formed above the poly center electrode 110. Formation of TTO 130 completes the processing of the lower portion of the cell. The trench in the lower portion does not change its shape after this step.

FIG. 15C shows the improved alignment possible with cells made according to the invention. Misalignment of the AA strips 210 in the vertical direction in FIG. 15C will not affect the amount of overlap between the strip and the rectangles 230.

The DRAM cell is completed by forming the vertical transistor in the upper trench conventionally by forming gate dielectric 203 on the trench walls, filling the upper trench with gate conductor 205 to form the transistor gate and forming the upper transistor electrode 210. The gate dielectric 203 may include, but is not limited to, oxide, nitride, $Al_2O_3$, $HfO_2$, HfSiO, $ZrO_2$, formed by conventional thermal growth and/or deposition processes. Preferably the gate dielectric 203 is an oxide layer with the thickness of 60 angstroms formed by thermal growth. Gate contact isolation 222 and the gate contact 205 are formed thereafter. The gate conducting material 205 may include, but is not limited to, doped polysilicon, metals, conducting nitride. Preferably the gate conductor 205 is arsenic-doped polysilicon formed by a LPCVD process.

Insulator 215 (Array Top Oxide) replaces the pad oxide and pad nitride.

Wordlines, comprised of a lower conducting layer 303, (e.g., doped polysilicon, tungsten, and/or tungsten silicide) and insulating cap 305 (e.g., nitride and/or oxide) make contact to gate 205. Sidewalls 307 along with the insulating layer 312 (e.g. BPSG), separate the gate contact from the bitline contacts 217 which connects to the upper electrode 210.

FIG. 15C shows the overlap between the enlarged trench cross section 230 and the AA strips 210. Dotted lines 520 indicate the acceptable tolerance for the sides of the upper trench.

FIG. 15B shows the enlarged cross section of hexagons 504 in the lower substrate.

PROCESS SUMMARY

The foregoing process may be summarized as:

In the first embodiment:

Prepare a first silicon wafer having a (100) silicon substrate oriented with axis parallel to the <100> directions on the surface, bonded to a second (100) silicon layer formed from silicon substrate oriented at 45 degrees to the <100> direction of the first wafer. The upper layer may have a silicon thickness of 50 nm to 500 nm suitable for forming the vertical transistors as shown and also conventional planar FETs in other portions of the circuit. The (100) substrate is defined as a substrate in which the crystallographic orientation of wafer surface is (100). Note that the substrate can also be a (010) or (001) wafer which is identical to a (100) wafer.

Form a trench through the upper silicon layer and the substrate

Etch the trench expanding the lower portion transversely while preserving the orientation of the sides of the lower portion of the trench and changing the shape of the upper portion of the trench from octagonal to rectangular.

Form a capacitor in the lower portion of the deep trench.

Form a vertical transistor in the upper portion.

The alternative embodiment has the following process flow:

Prepare a first silicon wafer having a (111) silicon lower substrate bonded to a second upper silicon layer formed from a (100) silicon substrate oriented with its one of the <110> crystallographic directions parallel to the long axis of the trenches that will be formed. The upper layer may have a silicon thickness of 50 nm to 500 nm suitable for forming the vertical transistors as shown and also conventional planar FETs in other portions of the circuit.

Form a trench through the upper silicon layer and the substrate

Etch the trench expanding the lower portion transversely while preserving the orientation of the sides of the lower portion of the trench and changing the shape of the upper portion of the trench from octagonal to rectangular.

Form a capacitor in the lower portion of the deep trench.

Form a vertical transistor in the upper portion.

Those skilled in the art will appreciate that the transistor in the upper portion may also be a planar transistor.

Those skilled in the art will further appreciate that the starting materials may be not only silicon but also a semiconductor or semiconductors with appropriate crystal structure, such as germanium, silicon germanium, silicon carbide, strained silicon, those consisting essentially of one or more III-V compound semiconductors such as gallium arsenic, gallium phosphorus, and those consisting essentially of one or more II-VI compound semiconductors such as zinc sulphur, zinc selenium, etc.

If desired, the lower substrate 10 may be silicon and the upper SOI layer 15 may be SiGe, in order to provide the higher transistor speed characteristic of SiGe in other parts of the circuit.

If desired, three or more semiconductor layers with various orientations can be bonded for optimal device performance. .

Box 400 represents schematically I/O circuits for a DRAM, other logic for an embedded DRAM array, circuits for a system on a chip, etc.

While the invention has been described in terms of two preferred embodiments, those skilled in the art will recognize that the invention can be practiced in various versions within the spirit and scope of the following claims.

What is claimed is:

1. An integrated circuit formed in a semiconductor substrate comprising:
    at least one memory cell comprising a bonded semiconductor structure having a lower substrate with a first crystal structure and an upper semiconductor layer with an (001) crystal structure and having its [010]axis at an angle of forty-five degrees with respect to a first wafer direction, said lower substrate being bonded to said upper semiconductor layer,
    a set of at least one trench having trench axes parallel to said first wafer direction of said lower substrate, said trench having a tower portion with a first cross section in said lower substrate, and an upper portion with a rectangular cross section in said upper semiconductor layer;
    a capacitor formed in said lower section: having at least one transverse capacitor dimension greater than one of said first and second transverse dimensions; and
    a transistor formed within said cell in said upper semiconductor layer.

2. A circuit according to claim 1, in which the upper layer and lower substrate have a (100) structure with a <110>configuration in said upper layer and a <100>configuration in said lower substrate.

3. A circuit according to claim 2, in which the trench in the upper portion has a rectangular shape aligned with said first wafer direction and the trench in the lower portion has a rectangular shape at an angle of 45 degrees with respect to said first wafer direction.

4. A circuit according to claim 1, in which the upper layer has a (100) structure with a <110> configuration and the lower substrate has a (111) structure.

5. A circuit according to claim 4, in which the trench in the upper portion has a rectangular shape aligned with said first wafer direction and the trench in the lower portion has a hexagonal cross section.

6. An integrated circuit according to claim 1, in which said lower substrate and said upper semiconductor layer are both formed from silicon.

7. An integrated circuit according to claim 1, in which said lower substrate is formed from silicon and said upper semiconductor layer and said upper layer is formed from silicon-germanium alloy.

8. An integrated circuit according to claim 1, further comprising a logic circuit portion and an array of said memory cells in which:
    said array of memory cells are formed in a bonded semiconductor structure having a lower substrate with a first crystal structure and an upper semiconductor layer with an (001) crystal structure and having its [010] axis at an angle of forty-five degrees with respect to a first wafer direction, said lower substrate being bonded to said upper semiconductor layer;
    a trench in each of said array of memory cells having a trench axis parallel to said first wafer direction of said lower substrate, said trench having a lower portion with a first cross section in said lower substrate, and an upper portion with a rectangular cross section in said upper semiconductor layer;
    a capacitor formed in said lower section, having at least one transverse capacitor dimension greater than one of said first and second transverse dimensions; and
    a transistor formed within said cell in said upper semiconductor layer.

* * * * *